(12) United States Patent
Yamagata (10) Patent No.: US 6,657,530 B2
(45) Date of Patent: Dec. 2, 2003

(54) MULTI-LAYERED INDUCTANCE ELEMENT

(75) Inventor: Kousaku Yamagata, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/162,635

(22) Filed: Jun. 6, 2002

(65) Prior Publication Data

US 2003/0112115 A1 Jun. 19, 2003

(30) Foreign Application Priority Data

Dec. 14, 2001 (JP) ....................................... 2001-381994

(51) Int. Cl.⁷ .................................................. H01F 5/00
(52) U.S. Cl. ........................ 336/200; 336/223; 336/232
(58) Field of Search ............................... 336/200, 223, 336/232; 29/602.1

(56) References Cited

U.S. PATENT DOCUMENTS

| | | | |
|---|---|---|---|
| 4,021,705 A | * 5/1977 | Lichtblau | .................... 361/765 |
| 5,629,553 A | * 5/1997 | Ikeda et al. | ................. 257/531 |
| 6,124,779 A | 9/2000 | Yamamoto | |
| 6,175,293 B1 | 1/2001 | Hasegawa et al. | |
| 6,175,727 B1 | * 1/2001 | Mostov | ..................... 455/307 |
| 2001/0041401 A1 | 11/2001 | Ahn et al. | |

FOREIGN PATENT DOCUMENTS

| | | |
|---|---|---|
| EP | 0 484 558 | 5/1992 |
| EP | 0 631 293 | 12/1994 |
| JP | 3-77360 | 4/1991 |
| JP | 4-148514 | 5/1992 |
| JP | 2695342 | 9/1997 |

* cited by examiner

*Primary Examiner*—Anh Mai
(74) *Attorney, Agent, or Firm*—Oblon, Spivak, McClelland, Maier & Neustadt, P.C.

(57) ABSTRACT

On each surface of a dielectric substrate, arranged are a first conductor line pattern having a plurality of first line segments and a second conductor line pattern having a plurality of second line segments. Ends of each first conductor line segment overlap the second conductor line segments, and the first and second line segments are connected via through-holes, thereby forming a single spiral conductor line. Each second conductor line segment for connecting adjacent first conductor line segments has a pair of end parts connected to the first conductor line segments via through-holes and a halfway part having a smaller width.

3 Claims, 7 Drawing Sheets

MULTI-LAYERED INDUCTANCE ELEMENT

BACKGROUND OF THE INVENTION

1. Field of the Invention

The present invention relates to a multi-layered inductance element.

2. Description of Background Art

Layered inductance elements have been utilized in radio frequency circuits or other electric circuits. As disclosed in JP-A-5-267973, a conventional multi-layered inductance element includes a plurality of layered dielectric substrates and looped conductor lines interposed therebetween. The looped conductor lines are interconnected via through-holes, thereby exhibiting a spiral configuration as a whole.

Figure 18:
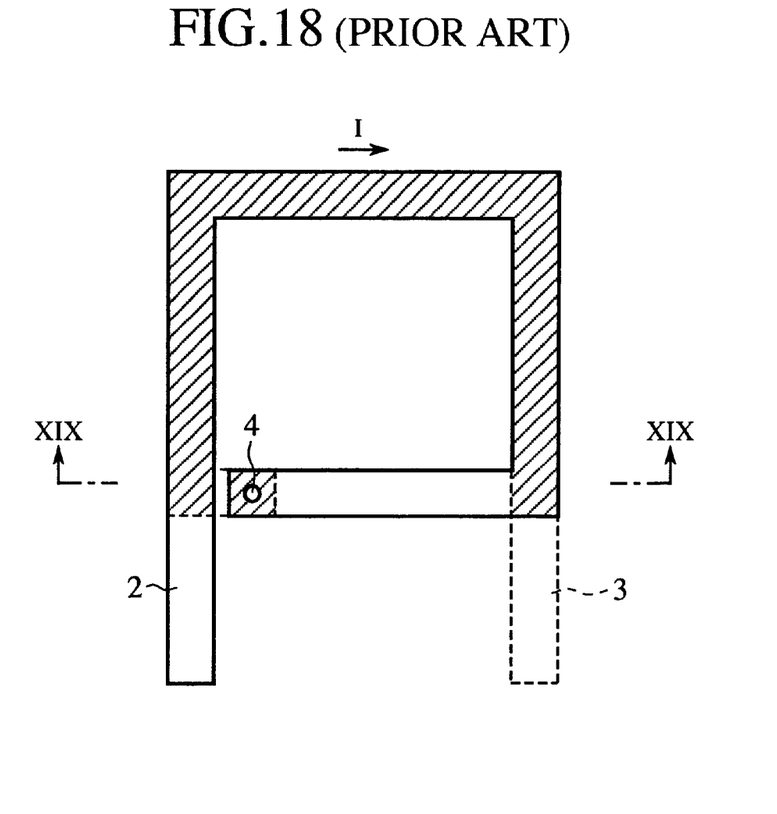
FIG. 18 is a top cross-sectional view of a conventional multi-layered inductance element, showing conductor line patterns of the multi-layered inductance element.
Figure 19:
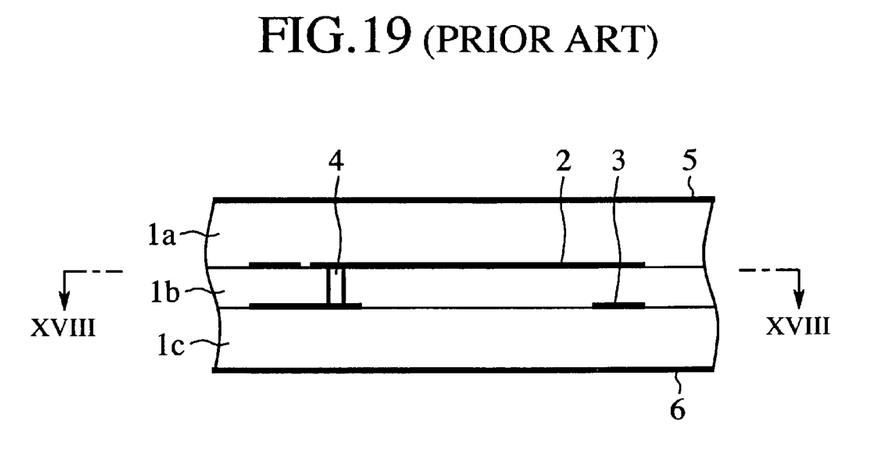
FIG. 19 is a cross-sectional view taken along line XIV—XIV in FIG. 18.

FIGS. 18 and 19 illustrate an example of conventional multi-layered inductance elements. As shown in the drawings, the multi-layered inductance element includes a plurality of dielectric substrates 1a, 1b, and 1c, conductor lines 2 and 3 interposed therebetween, a through-hole 4, and a pair of ground conducting layers 5 and 6. As shown in FIG. 19, the upper ground conducting layer 5 is provided on the top surface of the uppermost dielectric substrate 1a among the multi-layered dielectric substrates 1a, 1b, and 1c while the lower ground conducting layer 6 is disposed on the bottom surface of the lowermost dielectric substrates 1c.

The upper conductor line 2 is interposed between the dielectric substrates 1a and 1b while the lower conductor line 3 is interposed between the dielectric substrates 1b and 1c. The through-hole 4 is formed in the intermediate dielectric substrate 1b, resulting in that the upper and lower conductor lines 2 and 3 are electrically connected with each other via conducting materials inside the through-hole 4.

As shown in FIG. 18, each of the conductor lines 2 and 3 has a looped shape although it is not closed completely. The hatched parts in FIG. 18 depict parts of the conductor lines 2 and 3 overlapping with or superimposed over each other. Since one end of the conductor line 2 is connected with one end of the conductor line 3 via the through-hole 4, conductor lines 2 and 3 cooperate to form a continuous spiral conductor line, which is analogous to a coil, having an inductance. When a direct current is applied to the spiral conductor line, the direction of the current flow in the conductor line 2 is the same as that in the conductor line 3; for example, it is the clockwise direction as indicated by arrow I in FIG. 18. In addition, when an alternating current is applied, the direction of the current flow at each moment in the conductor line 2 is the same as that in the conductor line 3.

In connection with this kind of multi-layered inductance element, it has been considered that the upper and lower conductor lines 2 and 3 should extend over and coincide perfectly with each other when viewed along the vertical direction (direction of thickness) of the multi-layered inductance element. It has been also considered that the vertical distance between the conductor lines 2 and 3 is preferably small. The reason is that such a preferable structure will strengthen the coupling of electromagnetic fields around the conductor lines 2 and 3, whereby the multi-layered inductance element can have a great inductance although its dimensions may be small.

In the illustrated conventional multi-layered inductance element, each of the conductor lines 2 and 3 is formed continuously so that the loop on the same plane is as long as possible. The sole through-hole 4 is utilized for connecting the upper and lower conductor lines 2 and 3 comprising the single spiral conductor line.

The conventional multi-layered inductance element structured as described above has drawbacks that it is difficult to restrain the difference between the designed target inductance and the resulting inductance affected by an error in dimensions by manufacturing. It is also very difficult to adjust or tune the difference.

The drawbacks will be described in more detail. In such a multi-layered inductance element, the correlation between the positions of the conductor lines 2 and 3 is an important factor in quality. For example, when at least one of the conductor lines 2 and 3 is out of position so that the conductor lines 2 and 3 does not coincide with each other, the coupling of electromagnetic fields around the conductor lines 2 and 3 is degraded, resulting in decrease of the inductance.

In addition, if the thickness of the dielectric substrate 1b and hence the distance between the conductor lines 2 and 3 is small, the coupling of electromagnetic fields around the conductor lines 2 and 3 is strengthened, resulting in increase of the inductance. On the contrary, if the thickness of the dielectric substrate 1b is large, the inductance is decreased.

Accordingly, dimensional errors, such as positional errors of the conductor lines 2 and 3 and an error in thickness of the dielectric substrate 1b, lead variations of inductance in products of multi-layered inductance element.

SUMMARY OF THE INVENTION

Accordingly, it is an object of the present invention to provide a multi-layered inductance element, wherein it is possible to restrain variations of inductance caused by errors in dimensions by manufacturing.

A multi-layered inductance element according to the present invention includes at least one dielectric substrate having a first and second surfaces, a first conductor line pattern, a second conductor line pattern, and a plurality of through-holes penetrating through the dielectric substrate. The first conductor line pattern includes a plurality of first conductor line segments being apart from each other and disposed on the first surface of the dielectric substrate, wherein the first conductor line segments exhibit a substantially looped configuration as a whole if adjacent first conductor line segments are connected with each other. The second conductor line pattern includes a plurality of second conductor line segments being apart from each other and disposed on the second surface of the dielectric substrate, wherein the second conductor line segments exhibit a substantially looped configuration as a whole if adjacent second conductor line segments are connected with each other. Each through-hole electrically connects one end of one of the first conductor line segments and one end of one of the second conductor line segments. Each of the first conductor line segments extends over at least a part of one of the second conductor line segments. The plurality of first conductor line segments and the plurality of second conductor line segments are connected by the through-holes, thereby forming a spiral conductor line in which a direction of current flow in the first conductor line pattern is the same as that in the second conductor line pattern. Each of the second conductor line segments includes a pair of end parts and a halfway part having a width which is smaller than that of the end parts. The end parts are connected to adjacent first conductor line segments via the through-holes.

With such a structure, the halfway part with a smaller width of each second conductor line element tends to cancel an inductance decrement when the conductor line patterns are dislocated in relation to each other. In addition, the plurality of through-holes contributes to cancel an inductance variation when the thickness of the dielectric substrate varies. Therefore, the structure can restrain variations of inductance caused by errors in dimensions by manufacturing multi-layered inductance elements.

BRIEF DESCRIPTION OF THE DRAWINGS

With reference to the accompanying drawings, various embodiments of the present invention will be described hereinafter. In the drawings.

DETAILED DESCRIPTION OF PREFERRED EMBODIMENTS

First Embodiment.

Figure 1:
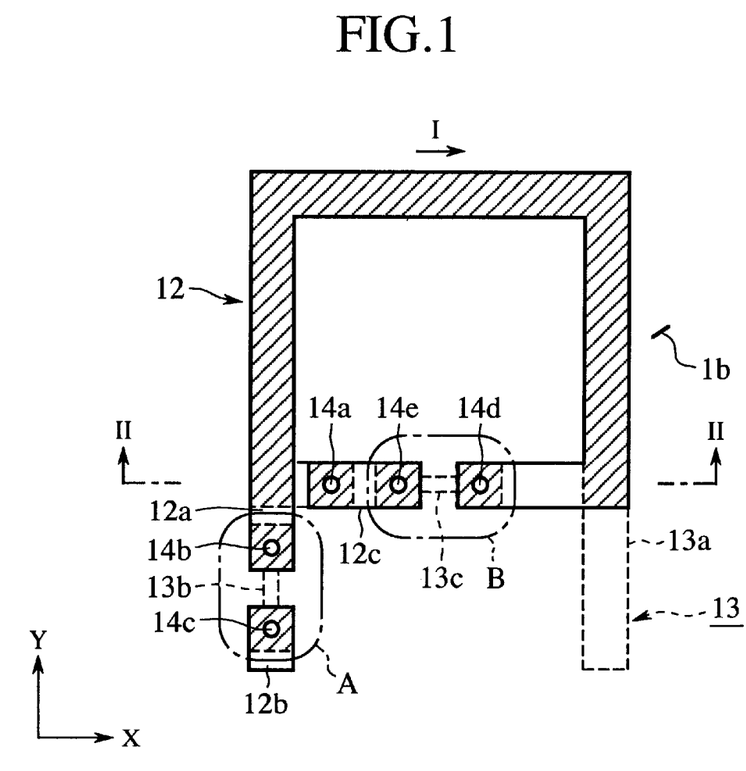
FIG. 1 is a top cross-sectional view of a multi-layered inductance element according to a first embodiment of the present invention, showing conductor line patterns of the multi-layered inductance element.
Figure 2:
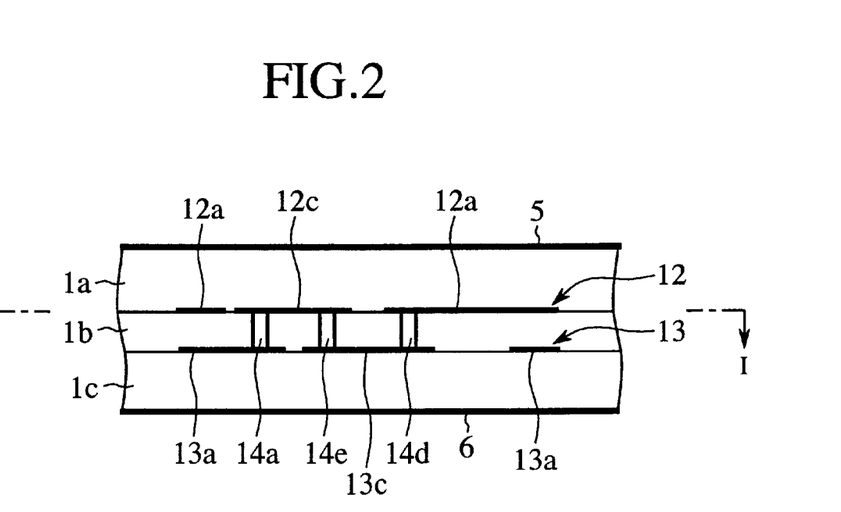
FIG. 2 is a cross-sectional view taken along line II—II in FIG. 1.

FIG. 1 is a top cross-sectional view of a multi-layered inductance element according to a first embodiment of the present invention, showing conductor line patterns of the multi-layered inductance element. FIG. 2 is a side cross-sectional view of the multi-layered inductance element. More exactly, FIG. 1 is a cross-sectional view taken along line I—I in FIG. 2 while FIG. 2 is a cross-sectional view taken along line II—II in FIG. 1.

As shown in the drawings, the multi-layered inductance element includes dielectric substrates $1a$, $1b$, and $1c$, a first conductor line pattern 12, a second conductor line pattern 13, and ground conducting layers 5 and 6. The first conductor line pattern 12 includes a plurality of first line segments $12a$ through $12c$ while the second conductor line pattern 13 includes a plurality of second line segments $13a$ through $13c$ connected to the first line segments $12a$ through $12c$ via through-holes $14a$ through $14e$.

As represented in FIG. 2, the upper ground conducting layer 5 is provided on the top surface of the uppermost dielectric substrate $1a$ among the multi-layered dielectric substrates $1a$, $1b$, and $1c$ while the lower ground conducting layer 6 is disposed on the bottom surface of the lowermost dielectric substrates $1c$.

The first conductor line pattern 12 is interposed between the dielectric substrates $1a$ and $1b$ while the second conductor line pattern 13 is interposed between the dielectric substrates $1b$ and $1c$. In the intermediate dielectric substrate $1b$, the through-holes $14a$ through $14e$ are formed to penetrate the dielectric substrate $1b$, resulting in that the conductor line patterns 12 and 13 on the upper and lower surfaces of the dielectric substrate $1b$ are electrically connected with each other via conducting materials inside the through-holes $14a$ through $14e$.

As shown in FIG. 1, each of the conductor line patterns 12 and 13 has a looped shape although it is not closed completely. The hatched parts in FIG. 1 depict parts of the conductor line patterns 12 and 13 overlapping with or superimposed over each other. The second conductor line pattern 13 and first conductor line pattern 12 will be described in more detail with reference to FIGS. 3 and 4.

Figure 3:
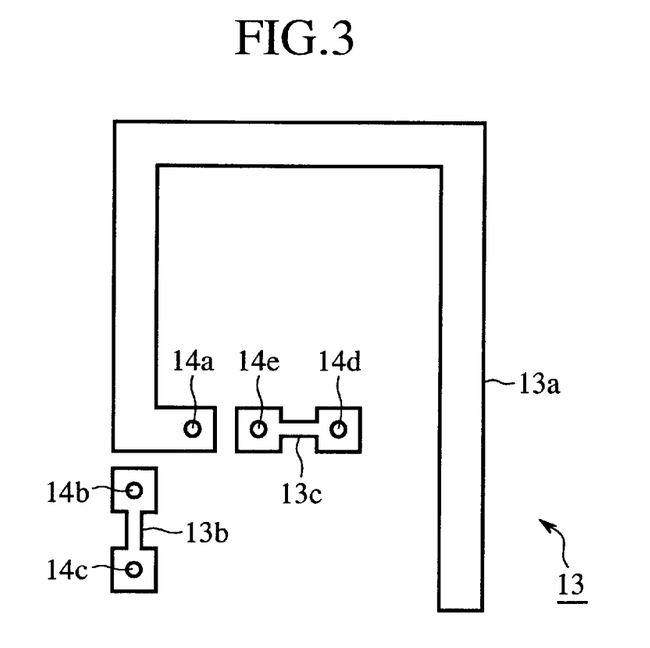
FIG. 3 is a plane view representing a second conductor line pattern in the multi-layered inductance element of FIG. 1 in detail.

As represented in FIG. 3, the second conductor line pattern 13 includes a plurality of (for example, three) second line segments $13a$ through $13c$ being apart from one another. In other words, the second conductor line pattern 13 has two gaps where adjacent first conductor line segments are spaced apart. All of the second line segments $13a$ through $13c$ are located on a surface of the dielectric substrate $1b$.

Among those second line segments $13a$ through $13c$, the longest second line segment $13a$ includes four straight parts having a uniform width. In the second line segment $13a$, the upper ends of two straight parts extending in parallel along the ordinate direction in FIG. 3 are connected at right angles with each end of the upper straight part extending along the abscissa direction. The lower end of the left straight part extending along the ordinate direction in FIG. 3 is connected at a right angle with an end of the lower shortest straight part extending along the abscissa direction. The lower shortest straight part extending along the abscissa direction is directed toward the right longest straight part extending along the ordinate direction. Accordingly, the second line segment $13a$ itself exhibits a looped configuration although it is not closed completely.

Another second line segment $13b$ is aligned in the extending direction of the left straight part of the second line segment $13a$. Although the second line segment $13b$ extends straightly, only both end parts thereof have the same width as that of the second line segment $13a$ while the halfway part thereof is coarctate.

A further second line segment $13c$ is aligned in the extending direction of the lower straight part of the second line segment 13a. Accordingly, the short second line segment 13c is angled at 90 degrees with the short second line segment 13b. Although the second line segment 13c extends straightly, only both end parts thereof have the same width as that of the second line segment 13a while the halfway part thereof is coarctate. As illustrated, the second line segments 13b and 13c have the same dimensions and the same shape. However, the dimensions and/or shapes of the second line segments 13b and 13c may vary from each other.

The second conductor line pattern 13 exhibits a substantially looped configuration as a whole if the adjacent second line segments 13a and 13c are interconnected and the adjacent second line segments 13a and 13b are also interconnected.

Figure 4:
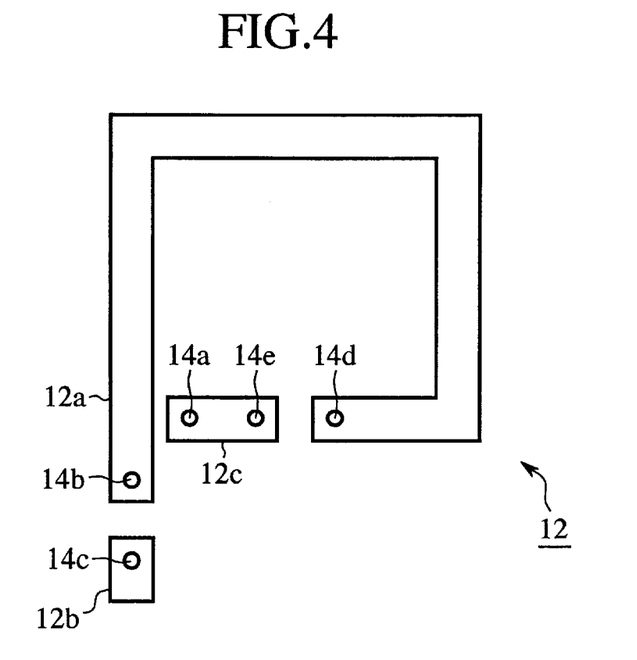
FIG. 4 is a plane view representing a first conductor line pattern in the multi-layered inductance element of FIG. 1 in detail.

Referring now to FIG. 4, the first conductor line pattern 12 includes a plurality of (for example, three) first line segments 12a through 12c being apart from one another. In other words, the first conductor line pattern 12 has two gaps where adjacent second conductor line segments are spaced apart. All of the first line segments 12a through 12c are located on a surface of the dielectric substrate 1b, which is opposite to the surface on which the second line segments 13a through 13c are located.

Among those first line segments 12a through 12c, the longest first line segment 12a includes four straight parts having a uniform width. In the first line segment 12a, the upper ends of two straight parts extending in parallel along the ordinate direction in FIG. 4 are connected at right angles with each end of the upper straight part extending along the abscissa direction. The lower end of the right straight part extending along the ordinate direction in FIG. 4 is connected at a right angle with an end of the lower shortest straight part extending along the abscissa direction. The lower shortest straight part extending along the abscissa direction is directed toward the left longest straight part extending along the ordinate direction. Accordingly, the first line segment 12a itself exhibits a looped configuration although it is not closed completely.

A shorter first line segment 12b is aligned in the extending direction of the left straight part of the first line segment 12a. The first line segment 12b extends straightly and has a uniform width that is the same as that of the first line segment 12a.

Another shorter first line segment 12c is aligned in the extending direction of the lower straight part of the first line segment 12a. Accordingly, the first line segment 12c is angled at 90 degrees with the first line segment 12b. The first line segment 12c extends straightly and has a uniform width that is the same as that of the first line segment 12a.

The first conductor line pattern 12 also exhibits a looped configuration as a whole if the adjacent first line segments 12a and 12c are interconnected and the adjacent first line segments 12a and 12b are also interconnected.

As described above, the hatched parts in FIG. 1 depict parts of the conductor line patterns 12 and 13 overlapping with or superimposed over each other. Each of the first line segments 12a through 12c extends over at least a part of one of the second line segments 13a through 13c. Especially, end parts of the first and second line segments are placed over each other, and the overlapping end parts are electrically interconnected via any of the through-holes 14a through 14e.

More specifically, most of the first line segment 12b at the bottom left-hand corner in FIG. 1 extends over one end part of the second line segment 13b, and the overlapping parts are interconnected via the through-hole 14c. The other end part of the second line segment 13b extends over one end part of the first line segment 12a, and the overlapping parts are interconnected via the through-hole 14b. The other end part of the first line segment 12a extends over an end part of the second line segment 13c, and the overlapping parts are interconnected via the through-hole 14d. The other end part of the second line segment 13c extends over an end part of the first line segment 12c, and the overlapping parts are interconnected via the through-hole 14e. The other end part of the first line segment 12c extends over an end part of the second line segment 13a, and the overlapping parts are interconnected via the through-holes 14a. Most of the second line segment 13a extends over most of the first line segment 12a. In connection with the overlapping parts, it is preferable that the side edges of both line segments 12a and 13a coincide perfectly with each other.

By the interconnection between the first and second conductor line patterns 12 and 13 via the through-holes 14a through 14e, the line segments 12b, 13b, 12a, 13c, 12c, and 13a cooperate to form a single continuous spiral conductor line, which is analogous to a coil, having an inductance. When a direct current is applied to the spiral conductor line, the direction of the current flow in the first conductor line pattern 12 is the same as that in the second conductor line pattern 13; for example, it is the clockwise direction as indicated by arrow I in FIG. 1. In addition, when an alternating current is applied, the direction of the current flow at each moment in the first conductor line pattern 12 is the same as that in the second conductor line pattern 13.

In the multi-layered inductance element, the first conductor line pattern 12 contains two gaps where adjacent first conductor line segments are spaced apart. More specifically, there are the gaps in parts A and B enclosed by dashed lines in FIG. 1: one is interposed between the first line segments 12b and 12a while the other gap is interposed between the first line segments 12c and 12a. The second line segment 13b extending over the gap in part A for connecting the adjacent first line segments 12b and 12a is angled at 90 degrees with the second line segment 13c extending over the gap in part B for connecting the adjacent first conductor line segments 12c and 12a.

Figure 5:
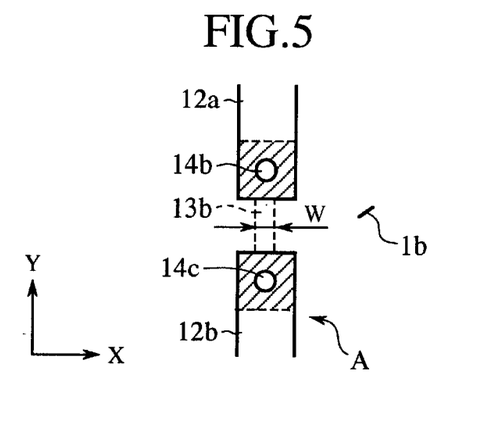
FIG. 5 is an enlarged view of part A in FIG. 1.

FIG. 5 is an enlarged view of part A in FIG. 1. As will be apparent from observation of part A illustrated in FIG. 5, the first line segment 12a is connected with the first line segment 12b via the through-hole 14b, the wider end part of the second line segment 13b, the coarctate halfway part of the second line segment 13b having a width W, the other wider end part of the second line segment 13b, and the through-hole 14c.

Let us assume that FIG. 5 shows the second line segment 13b formed at an ideal location in relation to the first line segments 12a and 12b. That is to say, both side edges of the wider end parts of the second line segment 13b coincide perfectly with the side edges of the first line segments 12a and 12b without any dislocation with respect to the abscissa direction (X direction). With respect to the ordinate direction (Y direction), the boundary between each end part and the coarctate halfway part of the second line segment 13b coincide perfectly with the end edge of the first line segment 12a or 12b without any dislocation.

Figure 6:
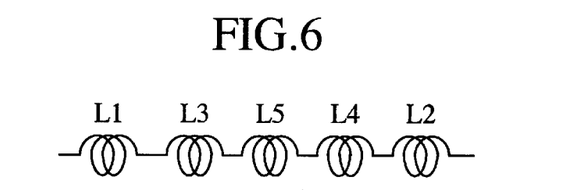
FIG. 6 is a schematic diagram showing a circuit equivalent to the structure shown in FIG. 5.

Next, operations will be described. FIG. 6 is a schematic diagram showing a circuit equivalent to the structure shown in FIG. 5. In FIG. 6, L1 and L2 indicate the inductance values of the through-holes 14b and 14c, respectively. L5 indicates the inductance of the halfway part of the second line segment 13b having a smaller width W. L3 and L4 indicate the inductance values of both end parts of the second line segment 13b, respectively.

Figure 7:
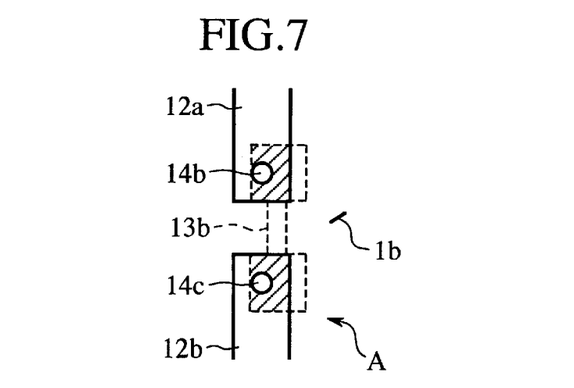
FIG. 7 is an enlarged view of part A in FIG. 1 when a positional error of conductor occurs in the abscissa direction.
Figure 8:
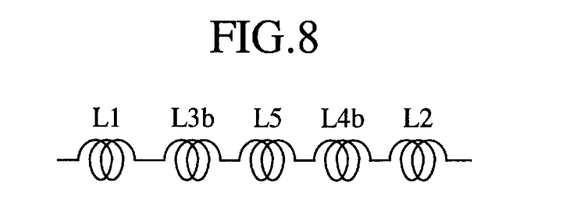
FIG. 8 is a schematic diagram showing a circuit equivalent to the structure shown in FIG. 7.

FIG. 7 represents the same structure as that shown in FIG. 5, but shows the second line segment 13b dislocated in relation to the first line segments 12a and 12b in X direction. FIG. 8 is a schematic diagram showing a circuit equivalent to the structure shown in FIG. 7. L3b and L4b in FIG. 8, which are counterparts of L3 and L4 in FIG. 6, indicate the inductance values of both end parts of the second line segment 13b, respectively.

In the structure shown in FIG. 7, the distance between each through-hole 14b or 14c and the halfway part of the second line segment 13b is broader than that in FIG. 5, so as to increase the inductance, whereby L3b>L3 and L4b>L4. However, the inductance values L1, L2, and L5 do not vary in connection with the structures in FIGS. 5 and 7 since the shapes and dimensions of the corresponding parts are the same. In X direction, the larger the dislocating amount of the second line segment 13b is, the larger the distance between each of the through-holes 14b and 14c and the second line segment 13b is, so that the inductance values L3b and L4b are increased.

The width W is in inverse proportion to the increments L3b−L3 and L4b−L4 caused by the dislocation, i.e., positional error in X direction. Therefore, the shorter the width W is, the larger the increments of inductance are.

Figure 9:
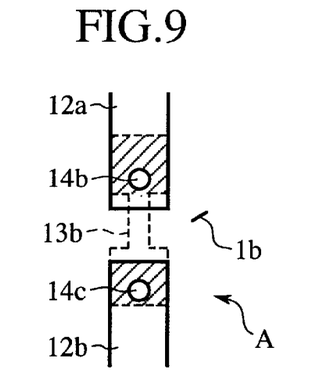
FIG. 9 is an enlarged view of part A in FIG. 1 when a positional error of conductor occurs in the ordinate direction.
Figure 10:
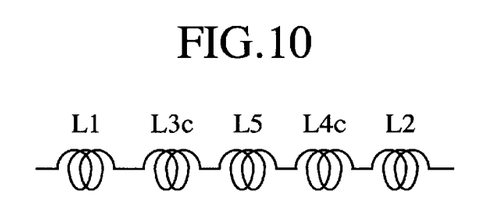
FIG. 10 is a schematic diagram showing a circuit equivalent to the structure shown in FIG. 9.

FIG. 9 also represents the same structure as that shown in FIG. 5, but shows the second line segment 13b dislocated in relation to the first line segments 12a and 12b in Y direction. FIG. 10 is a schematic diagram showing a circuit equivalent to the structure shown in FIG. 9. L3c and L4c in FIG. 10, which are counterparts of L3 and L4 in FIG. 6, indicate the inductance values of both end parts of the second line segment 13b, respectively.

When the second line segment 13b is dislocated in relation to the first line segments 12a and 12b in Y direction as shown in FIG. 9, the distance between each through-hole 14b or 14c and the halfway part of the second line segment 13b also vary. However, the increment of one of the distances is exactly equal to the decrement of the other distance, so that L3c+L4c=L3+L4. Accordingly, the total inductance in the circuit is kept unchanged.

Figure 11:
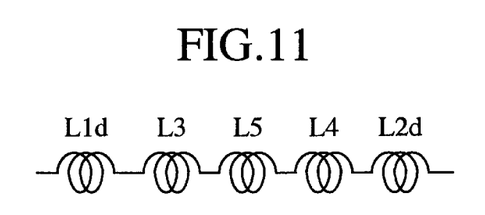
FIG. 11 is a schematic diagram showing a circuit equivalent to the structure of part A in FIG. 1 when the thickness of the dielectric substrate varies.

Next, an inductance variation when the thickness of the dielectric substrate 1b is reduced in the structure in FIG. 5 will be described. FIG. 11 shows a circuit equivalent to the structure of part A when the thickness of the dielectric substrate is reduced. L1d and L2d in FIG. 11, which correspond to L1 and L2 in FIG. 6, are inductance values of the through-holes 14b and 14c.

The length of a through-hole is proportional to the inductance thereof. Accordingly, if the thickness of the dielectric substrate 1b and hence the length of the through-holes 14b and 14c are smaller, the inductance values of through-holes 14b and 14c are decreased, so that L1d<L1 and L2d<L2. On the contrary, when the thickness of the dielectric substrate 1b is larger, L1d>L1 and L2d>L2.

On the other hand, the inductance of a through-hole tends to increase as the diameter thereof is reduced. Accordingly, the inductance increments L1d−L1 and L2d−L2 can be finely or slightly tuned or adjusted by changing the diameters of the through-holes 14b and 14c.

As described above, as the dislocating amount of the second line segment 13b increases in relation to the first line segments12a and 12b in X direction, the total inductance value tends to increase in the structure within part A shown in FIG. 3. In addition, the width W of the halfway part of the second line segment 13b is in inverse proportion to the increment of inductance caused by the dislocation, i.e., positional error in X direction. Therefore, the increment of inductance can be finely or slightly tuned or adjusted by altering the width W.

As to the structure within part A shown in FIG. 3, the total inductance is kept unchanged even if the second line segment 13b is dislocated in Y direction. If the thickness of the dielectric substrate 1b varies, the total inductance tends to vary. However, the variation can be finely or slightly tuned or adjusted by changing the diameters of the through-holes 14b and 14c.

Returning now to FIG. 1, let us observe the entire structure of the multi-layered inductance element. In the entire multi-layered inductance element in FIG. 1 except for parts A and B, if the conductor line patterns 12 and 13 are dislocated in relation to each other, the coupling of electromagnetic fields around the conductors that should be coincident with each other is degraded, resulting in decrease of the inductance, as discussed in conjunction with prior art.

However, as described above, if the conductor line patterns 12 and 13 are dislocated in relation to each other in X direction, part A contributes to increase the total inductance of the multi-layered inductance element according to the embodiment. Consequently, although most of the multi-layered inductance element becomes the factor of decrease of total inductance for the reason of dislocation in X direction, the second line segment 13b having the halfway part with a smaller width becomes the factor of increase of total inductance. Accordingly, it is possible to restrain a variation of inductance caused by a relative dislocation or positional error of the conductor line patterns 12 and 13 in X direction.

It is preferable to design the multi-layered inductance element, especially the second line segment 13b, in ideal dimensions so that the inductance increment resulting from the second line segment 13b balances with the inductance decrement resulting from other parts in order to maintain the total inductance unchanged completely at any degree of relative dislocation of the conductor line patterns 12 and 13 in X direction.

Furthermore, in an optional process, it is possible to finely or slightly tune or adjust the inductance increment in X direction resulting from the second line segment 13b by adjusting the width W of the halfway part of the second line segment 13b. In this case, the relation between relative dislocations of the conductor line patterns 12 and 13 in X direction and total inductance values of the multi-layered inductance elements are preferably obtained by, e.g., an experiment. At a stage in the manufacturing process, the relative dislocation of the conductor line patterns 12 and 13 in X direction is measured after the conductor line patterns 12 and 13 have been formed on both surfaces of the dielectric substrate 1b. On the basis of the measurement and the above-described relation, the width W of the halfway part of the second line segment 13b may be modified, so that the variation of the total inductance of the multi-layered inductance element may be minimized.

On the other hand, if there is a relative dislocation of the conductor line patterns 12 and 13 in Y direction, the total inductance of the multi-layered inductance element is increased by part B, which is equivalent to part A rotated by 90 degree. Consequently, although most of the multi-layered inductance element becomes the factor of decrease of total inductance for the reason of dislocation in Y direction, the second line segment 13c having the halfway part with a smaller width becomes the factor of increase of total inductance. Accordingly, it is possible to restrain a variation of inductance with respect to a relative dislocation or positional error of the conductor line patterns 12 and 13 in Y direction.

It is preferable to design the multi-layered inductance element, especially the second line segment 13c, in ideal dimensions so that the inductance increment resulting from the second line segment 13c balances with the inductance decrement resulting from other parts in order to maintain the total inductance unchanged completely at any degree of relative dislocation of the conductor line patterns 12 and 13 in Y direction.

Furthermore, in an optional process, it is possible to finely or slightly tune or adjust the inductance increment in Y direction resulting from the second line segment 13c by adjusting the width W of the halfway part of the second line segment 13c. In this case, the relation between relative dislocations of the conductor line patterns 12 and 13 in Y direction and total inductance values of the multi-layered inductance element is preferably obtained by, e.g., an experiment. At a stage in the manufacturing process, the relative dislocation of the conductor line patterns 12 and 13 in Y direction is measured after the conductor line patterns 12 and 13 have been formed on both surfaces of the dielectric substrate 1b. On the basis of the measurement and the above-described relation, the width W of the halfway part of the second line segment 13c may be modified, so that the variation of the total inductance of the multi-layered inductance element may be minimized.

Furthermore, when the multi-layered inductance element except for parts A and B in FIG. 1 is analyzed, if the thickness of the dielectric substrate 1b and hence the distance between the conductor line patterns 12 and 13 is small, the coupling of electromagnetic fields around the overlapping conductors is strengthened, resulting in increase of the inductance. On the contrary, if the thickness of the dielectric substrate 1b is large, the inductance is decreased. This problem has been also discussed in conjunction with prior art.

However, as described above, the length of a through-hole is proportional to the inductance thereof. Consequently, as long as effects of the through-holes, if the thickness of the dielectric substrate 1b is smaller, the inductance values are decreased. On the contrary, if the thickness of the dielectric substrate 1b is larger, the inductance values of the through-holes are increased. Since the embodiment of the multi-layered inductance element is provided with parts A and B, the multi-layered inductance element includes a plurality of through-holes 14a through 14e, which are more than those in usual structure, resulting in that the spiral conductor line meanders in the vertical direction (direction in the thickness) of the multi-layered inductance element.

Accordingly, even if most of the overlapping conductor line patterns 12 and 13 becomes the factor of variation of total inductance for the reason of variation of the thickness of the dielectric substrate 1b, the plurality of through-holes 14a through 14e become the factors for canceling the inductance variation. Therefore, it is also possible to restrain variation of inductance of the multi-layered inductance element.

It is preferable to design the multi-layered inductance element, especially the through-holes 14a through 14e, in ideal configurations so that the inductance variation resulting from the overlapping conductor line patterns 12 and 13 balances with the inductance variation resulting from the through-holes 14a through 14e in order to maintain the total inductance unchanged completely at any degree of thickness variation of the dielectric substrate 1b.

Furthermore, in an optional process, it is possible to finely or slightly tune or adjust the inductance variation resulting from the through-holes 14a through 14e by adjusting the one or more diameters of the through-holes 14a through 14e. In this case, the relation between the thickness of the dielectric substrate 1b and total inductance values of the multi-layered inductance element is preferably obtained by, e.g., an experiment. At a stage in the manufacturing process, the thickness of the dielectric substrate 1b is measured after the dielectric substrate 1b has been formed. On the basis of the measurement and the above-described relation, the diameter(s) of any or all of the through-holes 14a through 14e may be modified, so that the variation of the total inductance of the multi-layered inductance element may be minimized.

As described above, the first embodiment may restrain variation of inductance caused by an error in dimensions by manufacturing, such as a relative dislocation or positional error of the conductor line patterns 12 and 13 or an error in the thickness of the dielectric substrate 1b. Especially, since the second line segments 13b and 13c, which are means for restraining the inductance variation, are angled at 90 degrees with each other, it is possible to restrain the inductance variation caused by the relative dislocation of the conductor line patterns 12 and 13 in both of X and Y directions. Furthermore, the portions of which the configurations should be modified in the course of manufacturing are specific when it is attempted to adjust the inductance of the completed multi-layered inductance element. Therefore, the multi-layered inductance element with good characteristics or quality can be manufactured.

In the illustrated first embodiment, the adjacent first line segments 12a and 12b and the second line segment 13b connecting them are aligned linearly in part A. The same is true for part B containing the adjacent first line segments 12a and 12c and the second conductor line segment 13c connecting them. However, it is not intended to limit the present invention to the illustrated arrangement in first embodiment. Rather, other suitable arrangements may be accepted as follows.

Figure 12:
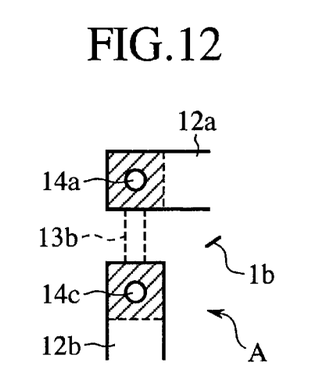
FIG. 12 is an enlarged view showing a variant of part A.
Figure 13:
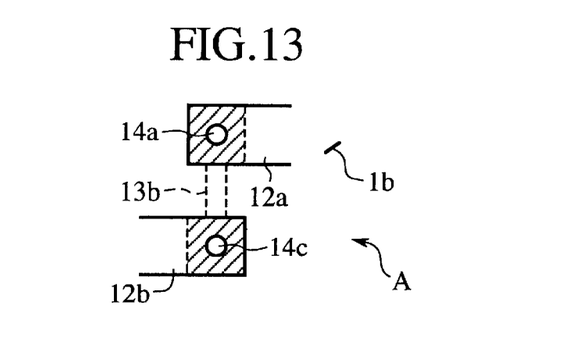
FIG. 13 is an enlarged view showing another variant of part A.
Figure 14:
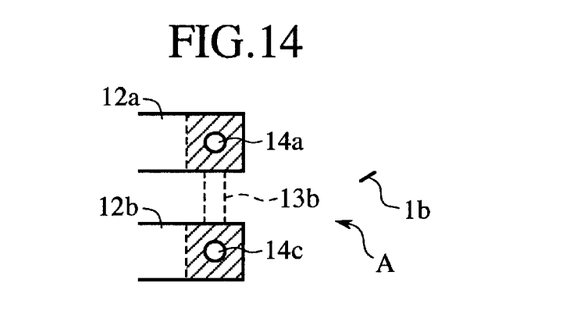
FIG. 14 is an enlarged view showing a further variant of part A.

FIGS. 12 through 14 show variants of part A. In the variant of part A in FIG. 12, the second line segment 13b and the first line segment 12b are aligned in straight in the ordinate direction while the first line segment 12a is disposed in the abscissa direction, forming an angle of 90 degrees with them.

In the variant of part A in FIG. 13, the first line segments 12a and 12b are aligned in parallel in the abscissa direction while the second line segment 13b is disposed in the ordinate direction, forming an angle of 90 degrees with them. The first line segment 12a extends rightward from the end that is connected with the second line segment 13b while the first line segment 12b extends leftward oppositely.

In the variant of part A in FIG. 14, the first line segments 12a and 12b are aligned in parallel in the abscissa direction while the second line segment 13b is disposed in the ordinate direction, forming an angle of 90 degrees with them. The first line segment 12a extends leftward from the end that is connected with the second line segment 13b and the first line segment 12b extends leftward similarly.

These variants achieve the same advantageous effects as those described above. Similar variants may be utilized for part B.

Second Embodiment.

Figure 15:
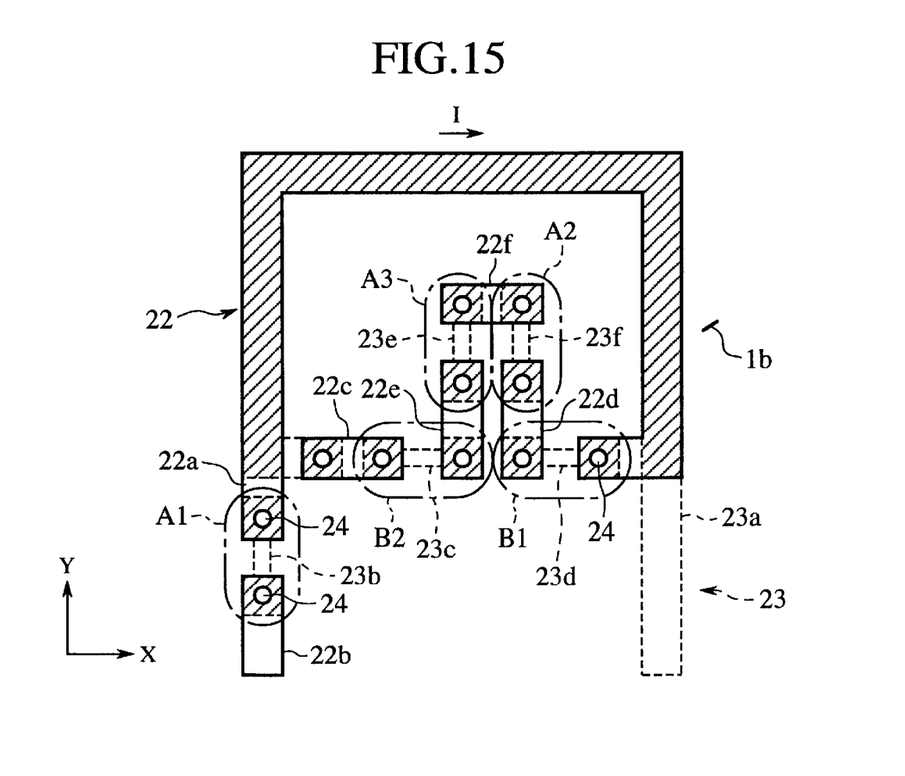
FIG. 15 is a top cross-sectional view of a multi-layered inductance element according to a second embodiment of the present invention, showing conductor line patterns of the multi-layered inductance element.

FIG. 15 is a top cross-sectional view of a multi-layered inductance element according to a second embodiment of the present invention, showing conductor line patterns of the multi-layered inductance element. In FIG. 15, symbol 1b designates a dielectric substrate, 22 designates a first conductor line pattern, 23 designates second conductor line pattern, and 24 designates through-holes. Reference symbols 22a through 22f depict first line segments belonging to the first conductor line pattern 22, and 23a through 23f depict second line segments belonging to the second conductor line pattern 23.

The embodiment of the multi-layered inductance element also includes multi-layered dielectric substrates as similar to the structure of the first embodiment shown in FIG. 2. Upper and lower ground conducting layers are disposed on the upper surface of the uppermost dielectric substrate and the lower surface of the lowermost surface of the dielectric substrate. Thus, the side cross-sectional view of the multi-layered inductance element is similar to FIG. 2. FIG. 15 is a cross-sectional view taken along line I—I in FIG. 2, similarly to FIG. 1. The dielectric substrate 1b shown in FIG. 15 is the intermediate dielectric substrate among the multi-layered inductance element.

The first conductor line pattern 22 is disposed on a surface of the dielectric substrate 1b and is interposed between the dielectric substrate 1b and another dielectric substrate. The second conductor line pattern 13 is disposed on another surface of the dielectric substrate 1b and is interposed between the dielectric substrate 1b and a further dielectric substrate. In the intermediate dielectric substrate 1b, the through-holes 24 are formed to penetrate the dielectric substrate 1b, resulting in that the conductor line patterns 22 and 23 on the upper and lower surfaces of the dielectric substrate 1b are electrically connected with each other via conducting materials inside the through-holes 24.

The hatched parts in FIG. 15 depict parts of the conductor line patterns 22 and 23 overlapping with or superimposed over each other. The second conductor line pattern 23 and first conductor line pattern 22 will be described in more detail with reference to FIGS. 16 and 17.

Figure 16:
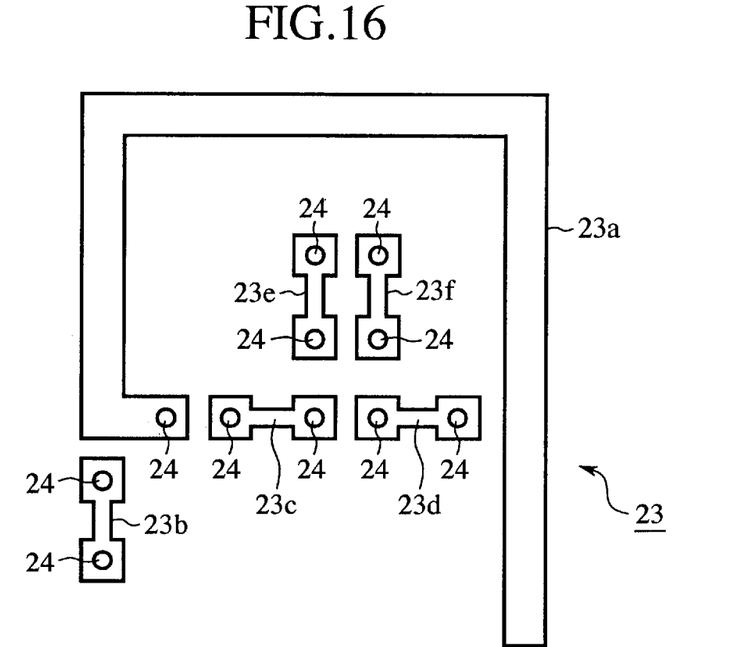
FIG. 16 is a plane view representing a second conductor line pattern in the multi-layered inductance element of FIG. 15 in detail.

As represented in FIG. 16, the second conductor line pattern 23 includes a plurality of (for example, six) second line segments 23a through 23f being apart from one another. In other words, the second conductor line pattern 23 has substantially five gaps where adjacent first conductor line segments are spaced apart. The second conductor line pattern 23 exhibits a substantially looped configuration as a whole if the adjacent second line segments 23b, 23a, 23d, 23f, 23e, and 23c are interconnected.

Among those second line segments 23a through 23f, the longest second line segment 23a includes four straight parts having a uniform width, and itself exhibits a looped configuration although it is not closed completely. Each of the other second line segments 23b through 23f extends linearly, but only both end parts thereof have the same width as that of the second line segment 23a while the halfway part thereof is coarctate. The second line segments 23b through 23f are equivalent to the second line segments 13b and 13c of the first embodiment. As best shown in FIG. 16, while the second line segments 23b, 23e, and 23f extend in the ordinate direction, the second line segments 23c and 23d extends in the abscissa direction. Consequently, three second line segments 23b, 23e, and 23f are angled at 90 degrees with two second line segments 23c and 23d.

Figure 17:
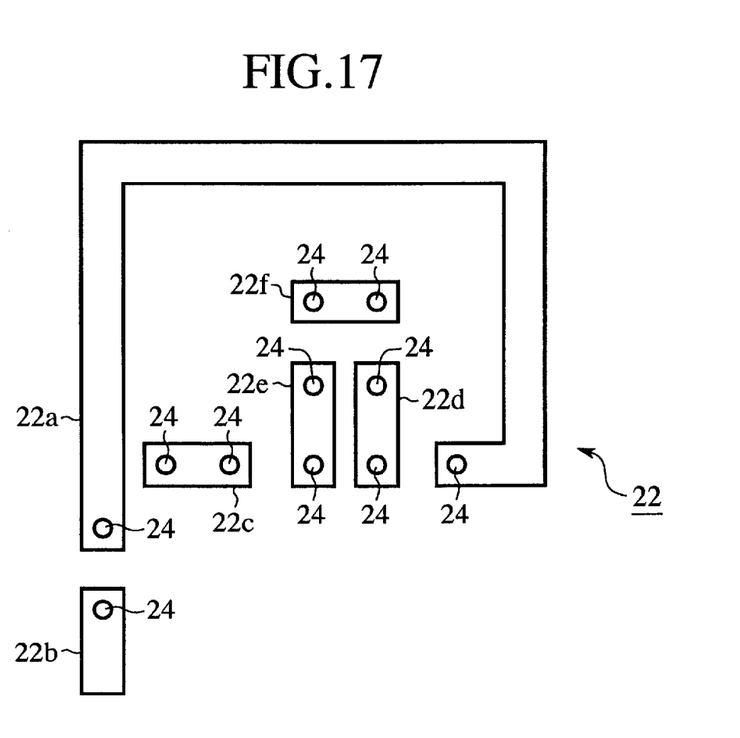
FIG. 17 is a plane view representing a first conductor line pattern in the multi-layered inductance element of FIG. 15 in detail.

Referring now to FIG. 17, the first conductor line pattern 22 includes a plurality of (for example, six) first line segments 22a through 22f being apart from one another. In other words, the first conductor line pattern 22 has substantially five gaps where adjacent second conductor line segments are spaced apart. All of the first line segments 22a through 22f are located on a surface of the dielectric substrate 1b, which is opposite to the surface on which the second line segments 23a through 23f are located. The first conductor line pattern 22 exhibits a substantially looped configuration as a whole if the adjacent first line segments 22b, 22a, 22d, 22f, 22e, and 22c are interconnected.

Among those first line segments 22a through 22f, the longest first line segment 22a includes four straight parts having a uniform width, and itself exhibits a looped configuration although it is not closed completely. Each of the other first line segments 22b through 22f extends straightly and has a rectangular shape with a uniform width that is the same as that of the first line segment 22a. These first line segments 22b through 22f are equivalent to the first line segments 12b and 12c in the first embodiment. As best shown in FIG. 16, while the first line segments 22b, 22e, and 22d extends in the ordinate direction, the first line segments 22c and 22f extends in the abscissa direction. Consequently, three first line segments 22b, 22e, and 22d are angled at 90 degrees with two first line segments 22c and 22f.

As described above, the hatched parts in FIG. 15 depict parts of the conductor line patterns 22 and 23 overlapping with or superimposed over each other. Each of the first line segments 22a through 22f extends over at least a part of one of the second line segments 23a through 23f. Especially, end parts of the first and second line segments are placed over each other.

More specifically, an end part of the first line segment 22b at the bottom left-hand corner in FIG. 15 extends over one end part of the second line segment 23b while the other end part of the second line segment 23b extends over one end part of the first line segment 22a. The other end part of the first line segment 22a extends over one end part of the second line segment 23d while the other end part of the second line segment 23d extends over one end part of the first line segment 22d. The other end part of the first line segment 22d extends over one end part of the second line segment 23f while the other end part of the second line segment 23f extends over one end part of the first line segment 22f. The other end part of the first line segment 22f extends over one end part of the second line segment 23e while the other end part of the second line segment 23e extends over one end part of the first line segment 22e. The other end part of the first line segment 22e extends over one end part of the second line segment 23c while the other end part of the second line segment 23c extends over one end part of the first line segment 22c. The other end part of the first line segment 22c extends over one end part of the second line segment 23a while most of the second line segment 23a extends over most of the first line segment 22a.

The overlapping end parts are electrically interconnected via one of the through-holes 24. By the interconnection between the first and second conductor line patterns 22 and 23 via the through-holes 24, the line segments cooperate to form a single continuous spiral conductor line, which is analogous to a coil, having an inductance. When a direct current is applied to the spiral conductor line, the direction of the current flow in the first conductor line pattern 22 is the same as that in the second conductor line pattern 23, for example, it is the clockwise direction as indicated by arrow I in FIG. 15. In addition, when an alternating current is applied, the direction of the current flow at each moment in the first conductor line pattern 22 is the same as that in the second conductor line pattern 23.

In the multi-layered inductance element, the first conductor line pattern 22 contains five gaps where adjacent first conductor line segments are spaced apart. More specifically, there are the gaps in parts A1 through A3 and B1 and B2 enclosed by dashed lines in FIG. 15: the first gap is interposed between the first line segments 22b and 22a in part A1, the second is between the first line segments 22d and 22f in part A2, the third is between the first line segments 22f and 22e in part A3, the fourth is between the first line segments 22a and 22d in part B1, the last is between the first line segments 22e and 22c in part B2. The second conductor line segment 23b extending over the gap in part A1 for connecting the adjacent first line segments 22b and 22a; the second conductor line segment 23f extending over the gap in part A2 for connecting the adjacent first line segments 22d and 22f, and the second conductor line segments 23e extending over the gap in part A3 for connecting the adjacent first line segments 22f and 22e are angled at 90 degrees with the second line segments 23d extending over the gap in part B1 for connecting the first conductor line segments 22a and 22d; and the second conductor line segment 23d extending over the gap in part B2 for connecting the first line segments 22e and 22c.

In accordance with the embodiment, when there is a relative dislocation or positional error of the conductor line patterns 22 and 23 in X direction, the total inductance of the multi-layered inductance element is increased by virtue of the narrower halfway parts of the second line segments 23b, 23f, and 23e in parts A1, A2, and A3. The inductance increment resulting from parts A1, A2, and A3 may compensate for the inductance decrement as a result of the coupling weakening of electromagnetic fields around two conductors, which are not coincident with each other. Furthermore, in accordance with the embodiment, a plurality of parts A1, A2, and A3 are provided for restraining the impedance variation due to the relative dislocation of the conductor line patterns 22 and 23 in X direction. Accordingly, although the impedance depends on the configurations of the conductor line patterns 22 and 23, it is possible to remarkably restrain variation of the total inductance in the multi-layered inductance element in comparison with another embodiment including only a single part for restraining impedance variation.

In addition, when there is a relative dislocation or positional error of the conductor line patterns 22 and 23 in Y direction, the total inductance of the multi-layered inductance element is increased by virtue of the narrower halfway parts of the second line segments 23d and 23c in parts B1 and B2. The inductance increment resulting from parts B1 and B2 may compensate for the inductance decrement as a result of the coupling weakening of electromagnetic fields around two conductors, which are not coincident with each other. Furthermore, in accordance with the embodiment, a plurality of parts B1 and B2 are provided for restraining the impedance variation due to the relative dislocation of the conductor line patterns 22 and 23 in Y direction. Accordingly, although the impedance depends on the configurations of the conductor line patterns 22 and 23, it is possible to remarkably restrain variation of the total inductance in the multi-layered inductance element in comparison with another embodiment including only a single part for restraining impedance variation.

Furthermore, even if most of the overlapping conductor line patterns 22 and 23 becomes the factor of variation of total inductance for the reason of variation of the thickness of the dielectric substrate 1b, the plurality of through-holes 24 become the factors for canceling the inductance variation. Therefore, it is also possible to restrain variation of inductance of the multi-layered inductance element. In accordance with the embodiment, as a result of provision of a greater number of parts A1, A2, A3, B1, and B2, the number of the through-holes 24 is increased. This also contributes to remarkably restrain variation of the total inductance in the multi-layered inductance element although the inductance also depends on the configurations of the conductor line patterns 22 and 23.

As described above, in accordance with the second embodiment, although the impedance depends on the configurations of the conductor line patterns 22 and 23, it is possible to remarkably restrain variation of the total inductance in the multi-layered inductance element.

In the first and second embodiments, two conductor line patterns on both surfaces of the intermediate dielectric substrate, and the through-holes penetrating through the dielectric substrate comprise a single spiral conductor line. However, two or more intermediate dielectric substrates may be provided and conductor line patterns on the respective intermediate dielectric substrates along with through-holes penetrating through the respective intermediate dielectric substrates may comprise a single spiral conductor line. The structure according to the present invention may be applied to such a modified configuration.

While the present invention has been particularly shown and described with references to preferred embodiments thereof, it will be understood by those skilled in the art that various changes in form and details may be made therein without departing from the spirit and scope of the invention as defined by the claims. Such variations, alterations, and modifications are intended to be encompassed in the scope of the claims.

What is claimed is:

1. A multi-layered inductance element comprising:

at least one dielectric substrate having a first and second surfaces;

a first conductor line pattern including a plurality of first conductor line segments being apart from each other and disposed on the first surface of the dielectric substrate, wherein the first conductor line segments exhibit a substantially looped configuration as a whole if adjacent first conductor line segments are connected with each other;

a second conductor line pattern including a plurality of second conductor line segments being apart from each other and disposed on the second surface of the dielectric substrate, wherein the second conductor line segments exhibit a substantially looped configuration as a whole if adjacent second conductor line segments are connected with each other; and a plurality of through-holes penetrating through the dielectric substrate, each through-hole electrically connecting one end of one of the first conductor line segments and one end of one of the second conductor line segments, wherein each of the first conductor line segments extends over at least a part of one of the second conductor line segments, the plurality of first conductor line segments being connected with the plurality of second conductor line segments via the through-holes, thereby forming a spiral conductor line in which a direction of current flow in the first conductor line pattern is the same as that in the second conductor line pattern, and wherein each of the second conductor line segments includes a pair of end parts and a halfway part having a width which is smaller than that of the end parts, the end parts being connected to adjacent first conductor line segments via the through-holes.

2. The multi-layered inductance element as recited in claim 1, wherein the first conductor line pattern contains at least two gaps where adjacent first conductor line segments are spaced apart, two second conductor line segments being disposed over the two gaps, respectively, and wherein one of the second conductor line segments over one of the gaps for connecting two adjacent first conductor line segments is angled at 90 degrees with the other of the second conductor line segments over the other of the gaps for connecting two adjacent first conductor line segments.

3. The multi-layered inductance element as recited in claim 2, wherein the first conductor line pattern contains at least four gaps where adjacent first conductor line segments are spaced apart, four second conductor line segments being disposed over the four gaps, and wherein two of the second conductor line segments over two of the gaps for connecting adjacent first conductor line segments are angled at 90 degrees with the other two of the second conductor line segments over the other two of the gaps for connecting adjacent first conductor line segments.

* * * * *